(12) United States Patent  
Utsunomiya

(10) Patent No.: US 6,674,311 B2
(45) Date of Patent: Jan. 6, 2004

(54) ELECTRONIC DEVICE HAVING A CMOS CIRCUIT

(75) Inventor: Fumiyasu Utsunomiya, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/245,413

(22) Filed: Sep. 17, 2002

(65) Prior Publication Data

US 2003/0053273 A1 Mar. 20, 2003

(30) Foreign Application Priority Data

Sep. 18, 2001 (JP) ...................................... 2001-283202

(51) Int. Cl.[7] .............................................. G01R 19/00
(52) U.S. Cl. ......................................................... 327/58
(58) Field of Search ............................. 327/50, 58, 60, 327/62, 63, 65, 66, 68, 72, 77, 143

(56) References Cited

U.S. PATENT DOCUMENTS 5,378,936 A * 1/1995 Kokubo et al. ............... 327/77
5,677,643 A * 10/1997 Tomita .......................... 327/78
5,998,974 A * 12/1999 Sudo et al. .................. 320/136

* cited by examiner

*Primary Examiner*—Jeffrey Zweizig
(74) *Attorney, Agent, or Firm*—Adams & Wilks

(57) ABSTRACT

A depletion type n-channel MOS transistor (hereinafter referred to as "D-type NMOS") as a MOS transistor of a SOI structure is disposed between a plus side power supply terminal of a CMOS circuit and a plus side terminal of a power supply unit so as to connect a source thereof to the pulse side power supply terminal of the CMOS circuit, to connect a drain thereof to the plus side terminal of the power supply unit, and to input to a gate thereof a voltage such that even if the voltage of the plus side terminal of the power supply unit exceeds the upper limit of the operation voltage of the CMOS circuit, the source of the D-type NMOS is equal to or lower than the upper limit of the operation voltage of the CMOS circuit, and the same voltage as the voltage of the plus side terminal of the power supply means when the voltage of the plus side terminal of the power supply means is the vicinity of the lower limit of the operation voltage of the CMOS circuit.

3 Claims, 2 Drawing Sheets

ELECTRONIC DEVICE HAVING A CMOS CIRCUIT

BACKGROUND OF THE INVENTION

1. Field of the Invention

The present invention relates to an electronic device having a CMOS circuit, and more particularly to an electronic device having a CMOS circuit for which a low voltage operation is required.

2. Description of the Related Art

FIG. 4 is a schematic circuit diagram showing conventional voltage detecting circuit. As shown in FIG. 4, the conventional voltage detecting circuit is mainly made up of p-channel MOS transistors (hereinafter referred to as "PMOS"), n-channel MOS transistors (hereinafter referred to as "NMOS"), a depletion type n-channel MOS transistor (hereinafter referred to as "D-type NMOS") which allows a drain current to flow even when a potential difference between the source and the gate is 0 V, and resistors. A first PMOS 304 has a source connected to a power supply terminal 101 and a drain connected to its gate, a drain of a D-type NMOS 305 and a gate of a second PMOS 306, respectively, and the D-type NMOS 305 has a source connected to its gate and a GND terminal 102. Also, the second PMOS 306 has a source connected to the power supply terminal 101 and a drain connected to a drain of a first NMOS 307 and a gate of a second NMOS 311, and the first NMOS 307 has a source connected to the GND terminal 102 and a gate connected to a second electrode of a first resistor 109 and to a first electrode of a second resistor 108, respectively. A first electrode of the first resistor 109 is connected to the power supply terminal 101, and a second electrode of the second resistor 108 is connected to the GND terminal 102. Also, an output resistor 110 has a first electrode connected to the power supply terminal 101 and a second electrode connected to an output terminal 103 and to a drain of the second NMOS 311, and a source of the second NMOS 311 is connected to the GND terminal 102.

Also, the power supply terminal 101 is connected to a plus side terminal of a power supply means such as a battery, and the GND terminal 102 is connected to a minus side terminal of the power supply means.

In the conventional voltage detecting circuit thus structured, a voltage detecting portion is made up of the first PMOS 304, the second PMOS 306, the D-type NMOS 305 and the first NMOS 307, a bleeder resistor portion is made up of the first resistor 109 and the second resistor 108, and an output portion is made up of the output resistor 110, the output terminal 103 and the second NMOS 311. Also the bleeder resister portion outputs a divided voltage generated by dividing the voltage of the power supply terminal 101 by the first resistor 109 and the second resistor 108, and the voltage detecting portion detects the voltage of the divided voltage, to thereby indirectly detect the voltage of the power supply terminal 101. The output portion reflects the detection result of the voltage detecting portion on the voltage of the output terminal 103.

In addition, FIG. 2 shows a graph of the voltage of the output terminal 103 (hereinafter referred to as "output voltage") to the voltage of the power supply terminal 101 (hereinafter referred to as "power supply voltage") of the voltage detecting circuit. A bold line and dotted line portion shown in FIG. 2 is a graph of the above-mentioned conventional voltage detecting circuit. A bold line and thin line portion is a graph of a voltage detecting circuit according to the present invention which will be described later. As is apparent from FIG. 2, it is found that when the power supply voltage drops from a state where the output voltage is the power supply voltage, the output voltage becomes the voltage of the GND terminal (hereinafter referred to as "GND voltage") with a boundary of a given power supply voltage. However, in the case where the output voltage originally drops down to the GND voltage, even if the power supply voltage further drops, the output voltage must naturally maintain the GND voltage. However, when the power supply voltage reaches a given voltage or lower, it is found that there occurs such as phenomenon that the output voltage becomes higher than the GND voltage. A region of the power supply voltage where such a phenomenon occurs is called "indefinite region", which is caused by a fact that the conventional voltage detecting circuit structured as described above cannot operate due to a drop of the power supply voltage. Also, the above-mentioned conventional voltage detecting circuit enters the indefinite region from a high power supply voltage of about 0.6 V.

The above-mentioned conventional voltage detecting circuit suffers from a problem in that, in an electronic device having the above-mentioned conventional voltage detecting circuit and a load circuit which is driven by a power of the above-mentioned power supply means, the load circuit is reset by using the output voltage of the above-mentioned conventional voltage detecting circuit.

In this case, since the power supply voltage of the load circuit drops with a drop of the voltage of the power supply means such as the battery, when the power supply voltage of the load circuit becomes a given voltage or lower, the load circuit conducts unstable, resulting in a problem in that the electronic device is fatally damaged in a system or hardware fashion.

In order to prevent this problem, it is necessary that in the case where the power of the power supply means becomes a voltage or lower at which the load circuit conducts the unstable operation, the conventional voltage detecting circuit drops the output voltage to the GND voltage from the power supply voltage so as to reset the load circuit, and the conventional voltage detecting circuit maintains the output voltage to the GND voltage until the power of the power supply means becomes a voltage or lower at which the load circuit cannot operate at all, to thereby maintain the reset of the load circuit.

However, the conventional voltage detecting circuit is high in the power supply voltage that enters the indefinite region. Therefore, in the conventional voltage detecting circuit, the power of the power supply means is caused to enter the indefinite region at a voltage which is higher than the voltage at which the load circuit cannot operate at all. For that reson, since the reset of the load circuit is canceled by the power supply voltage at which the load circuit conducts the unstable operation, the problem in that the load circuit is fatally damaged in the systematic or hardware fashion cannot be prevented. Also, this problem becomes increasingly severe since the power supply voltage region where the load circuit unstably operates is also lowered in voltage with the lower voltage operation of the load circuit in recent years.

In order to prevent the above-mentioned problem, in the conventional voltage detecting circuit, there may be applied a method in which the threshold voltages of the respective PMOSs and the respective NMOSs shown in FIG. 4 are lowered so as to drop the power supply voltage that enters the indefinite region. However, in this case, the leak currents of the respective PMOSs and the respective NMOSs increase with the result that there occurs a problem in that the current consumption of the conventional voltage detecting circuit applying the above method increases.

That is, summarizing the above contents, the conventional voltage detecting circuit has an object that the power supply voltage that enters the unstable region is dropped while preventing an increase in the current consumption in order to prevent the above-mentioned problems.

The above description is given of the problems on the voltage detecting circuit; however, it is needless to say that a CMOS circuit having other functions suffers from common problems in the case where the low voltage operation is required.

SUMMARY OF THE INVENTION

The present invention has been made under the above-mentioned circumstances, and therefore an object of the present invention is to provide a voltage detecting circuit which is capable of eliminating the problems with the conventional voltage detecting circuit.

To achieve the above object, according to a first aspect of the present invention, there is provided an electronic device including a CMOS circuit having a desired function, and a power supply means for supplying a power that drives the CMOS circuit, in which the CMOS circuit has at least one internal circuit structured by a MOS transistor of a complete depletion type SOI structure, in which a depletion type n-channel MOS transistor is disposed between the plus side terminal of the power supply means and the plus side power supply terminal of the one internal circuit, which suppresses a source voltage to a desired voltage or lower in the case where a drain voltage is a predetermined voltage or higher, and which gives a gate voltage so that the source voltage becomes equal to the drain voltage in the case where the drain voltage is lower than the predetermined voltage, and in which the one internal circuit is driven by the power of the power supply means which is supplied from the drain of the depletion type n-channel MOS transistor to the source thereof. Accordingly, there can be adopted the power supply means that supplies a power having a high voltage, and also it is possible to realize an electronic device having the CMOS circuit which can operate even if the voltage of the power of the power supply means is lowered and which is low in the power consumption.

Also, according to a second aspect of the present invention, there is provided an electronic device in which the CMOS circuit is a voltage detecting circuit which has a function of detecting a voltage of the plus side terminal of the power supply means, in which the voltage detecting circuit includes an output terminal that outputs a voltage detection result, a voltage dividing resistor portion that outputs a divided voltage resulting from dividing the voltage of the plus side terminal of the power supply means, a voltage detecting portion that detects the divided voltage and reflects the detection result on an output signal, and an n-channel MOS transistor of a complete depletion type SOI structure a gate of which receives the output signal, and has an output portion that fluctuates the voltage of the output terminal, in which the voltage detecting portion is structured by a MOS transistor of a complete depletion type SOI structure, and the depletion type n-channel MOS transistor is disposed between the plus side terminal of the power supply means and the pulse side power supply terminal of the voltage detecting portion, in which the voltage detecting circuit is driven by using the power of the power supply means which is supplied from the drain of the depletion type n-channel MOS transistor to the source thereof, in which the depletion type n-channel MOS transistor is also disposed between the drain of the n-channel MOS transistor of the complete depletion type SOI structure of the output portion and the output terminal, and in which a drain current of the n-channel MOS transistor of the completion depletion type SOI structure flows between the drain of the depletion type n-channel MOS transistor and the source thereof. With this structure, there can be adopted the power supply means which supplies a power having a high voltage, and also it is possible to realize the electronic device having the voltage detecting circuit which not only reflects the voltage detection result on the output terminal even if the voltage of the power of the power supply means is lowered, but also is low in the power consumption.

Further, according to a third aspect of the present invention, there is provided an electronic device further including a load circuit having a desired function, in which the load circuit is driven by the power of the power supply means and is also reset by the voltage of the output terminal of the voltage detecting circuit in the case where the voltage of the power of the power supply means is a predetermined voltage or lower. With this structure, there can be adopted the power supply means which supplies a power having a high voltage, and also it is possible to realize the electronic device having the voltage detecting circuit which not only reflects the voltage detection result on the output terminal even if the voltage of the power of the power supply means is lowered, but also is low in the power consumption, and having the load circuit which is not fatally damaged in the systematic or hardware fashion even if the voltage of the power of the power supply means is lowered.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of a preferred embodiment of the present invention with reference to the accompanying drawings.

Figure 1:
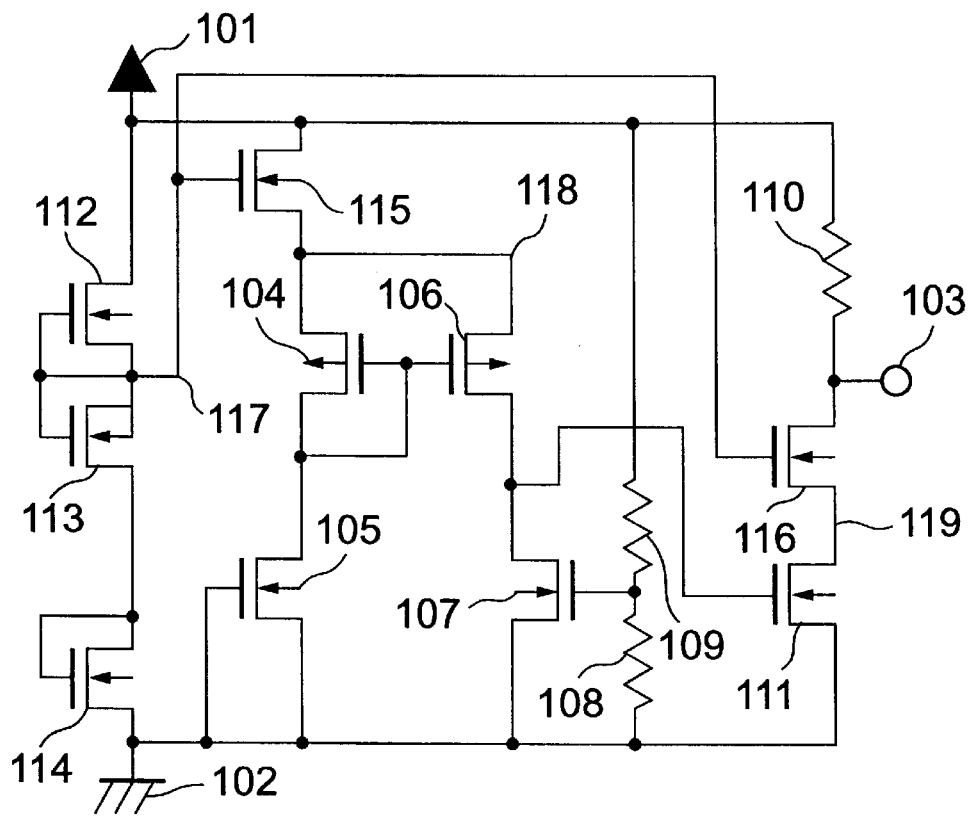
FIG. 1 is a schematic circuit diagram showing a voltage detecting circuit in accordance with an embodiment of the present invention.

FIG. 1 is a schematic circuit diagram showing a voltage detecting circuit in accordance with an embodiment of the present invention. In the conventional voltage detecting circuit shown in FIG. 4, the respective MOS transistors are of a normal bulk structure whereas in the voltage detecting circuit according to the present invention, there are adopted MOS transistors of a complete depletion type SOI structure which are excellent in the sub-threshold characteristic compared to the MOS transistors of the bulk structure.

Therefore, the p-channel MOS transistors of the complete depletion type SOI structure (hereinafter referred to as "FDSOIPMOS") and the n-channel MOS transistor of the complete depletion type SOI structure (hereinafter referred to as "FDSOINMOS") which are adopted in the voltage detecting circuit according to the present invention can lower the threshold voltage as compared with the PMOS and the NMOS which are adopted in the conventional voltage detecting circuit although an off-leak current is substantially identical between the voltage detecting circuit according to the present invention and the conventional voltage detecting circuit.

In the voltage detecting circuit according to the present invention, the depletion type n-channel MOS transistor of the complete depletion type SOI structure (hereinafter referred to as "D-type FDSOINMOS") is used for a portion that requires the same function as that of the D-type NMOS which is used in the conventional voltage detecting circuit from the viewpoint of the ease of the structure on the same chip since other MOS transistors are of the complete depletion type SOI structure. However, the D-type NMOS may be employed.

Figure 4:
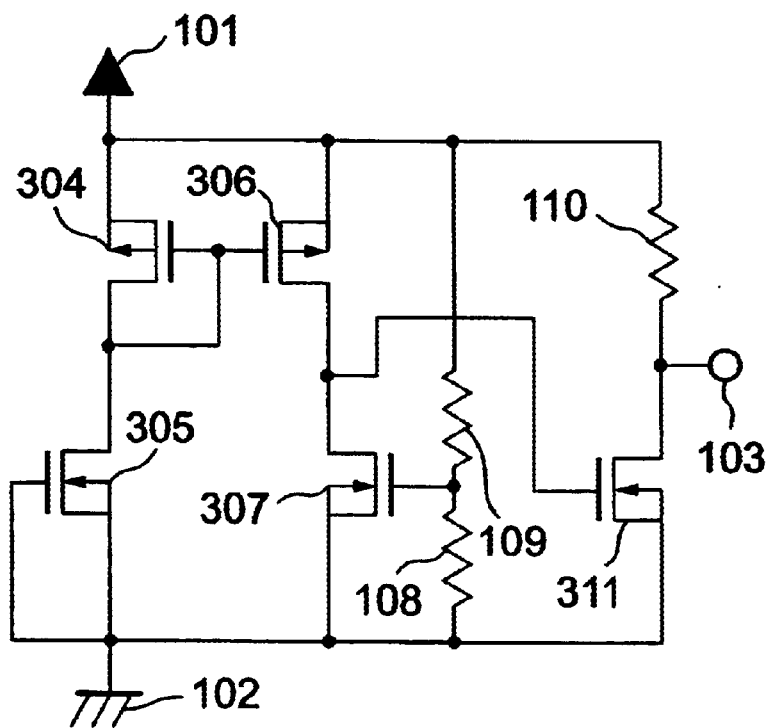
FIG. 4 is a schematic circuit diagram showing a conventional voltage detecting circuit.

Also, the voltage detecting circuit according to the present invention is different from the conventional voltage detecting circuit shown in FIG. 4 in that there is additionally provided a constant voltage output circuit which is made up of a third D-type FDSOINMOS 112, a third FDSOINMOS 114, a fourth FDSOINMOS 113 and so on, in that the first PMOS 304, the second PMOS 306, the D-type NMOS 305 and the first NMOS 307 which constitute the voltage detecting portion shown in FIG. 4, are replaced by a first FDSOINMOS 104, a second FDSOINMOS 106, a first D-type FDSOINMOS 105, and a first FDSOINMOS 107, respectively, as shown in FIG. 1, in that the second NMOS 311 that constitutes the output portion shown in FIG. 4 is replaced by a second FDSOINMOS 111 shown in FIG. 1, in that a first D-type FDSOINMOS 115 is disposed between the voltage detecting portion and the power supply terminal 101 so as to connect a drain thereof to the power supply terminal 101, to connect a source thereof to sources of the first FDSOIPMOS 104 and the second FDSOIPMOS 106, and to connect a gate thereof to an output of the constant voltage output circuit, and in that a second D-type FDSOINMOS 116 is disposed between the output terminal 103 of the output portion and the second FDSOINMOS 111 so as to connect a source thereof to drains of the second FDSOINMOS 111, to connect a drain thereof to the output terminal, and to connect a gate thereof to the output of the constant voltage output circuit.

In addition, in the constant voltage output circuit, the third D-type FDSOINMOS 112 has a drain connected to the power supply terminal 101, a source connected to its gate and to a first node 117, respectively, and the fourth FDSOINMOS 113 has a drain connected to its gate and to the first node 117, respectively. The third FDSOINMOS 114 has a source connected to the GND terminal 102 and a drain connected to its gate. A plurality of FDSOINMOSs that connect their gates to their drains, respectively, are connected in series between a source of the fourth FDSOINMOS 113 and the drain of the third FDSOINMOS 114, and the voltage value of a constant voltage which is outputted by the constant voltage output circuit can be adjusted by the number of the plural FDSOINMOSs which are connected in series. The first node 117 is the output of the constant voltage output circuit, and the respective MOS transistors of the constant voltage output circuit may be of the bulk structure.

First, the circuit performance of the voltage detecting circuit thus structured according to the present invention will be described.

Figure 2:
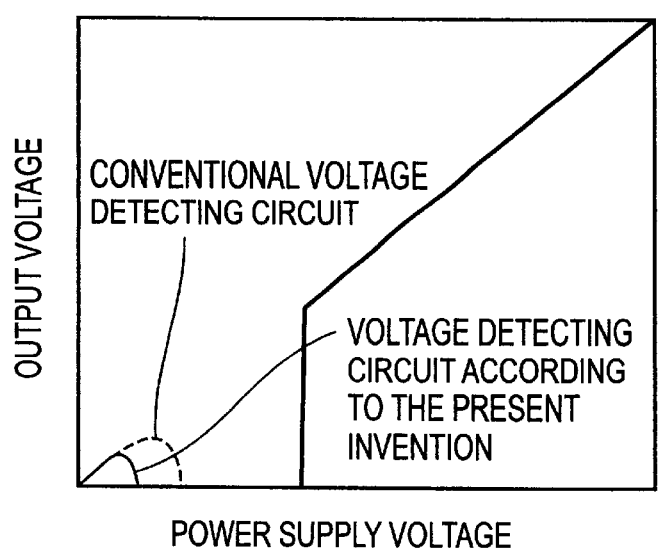
FIG. 2 is a graph showing an output voltage to a power supply voltage of the voltage detecting circuit according to the present invention.

FIG. 2 is a graph showing the output voltage with respect to the power supply voltage of the voltage detecting circuit according to the present invention. A bold line and thin line portion is a graph of the output voltage with respect to the power supply voltage of the voltage detecting circuit according to the present invention. As is apparent from FIG. 2, it is found that the power supply voltage does not enter an indefinite region until the power supply voltage becomes lower than that in the graph of the output voltage with respect to the power supply voltage of the conventional voltage detecting circuit indicated by a dotted line and a bold line. This is because the threshold voltages of the first FDSOIPMOS 104, the second FDSOIPMOS 106 and the first FDSOINMOS 107 in the voltage detecting circuit shown in FIG. 1, as well as the threshold voltage of the second FDSOINMOS 111 of the output portion shown in FIG. 1 are low. The current consumption of the voltage detecting circuit according to the present invention as shown in FIG. 1 increases by the current consumption of the constant voltage output circuit as compared with the conventional voltage detecting circuit shown in FIG. 4, but the current consumption of the voltage detecting portion and the output portion can maintain the same current consumption as that of the conventional voltage detecting circuit. This is because the leak currents of the respective MOS transistors shown in FIG. 1 can be suppressed to the same degree of the leak currents of the respective MOS transistors shown in FIG. 4.

Then, the circuit characteristics of the above-described voltage detecting circuit according to the present invention will be described.

Figure 3:
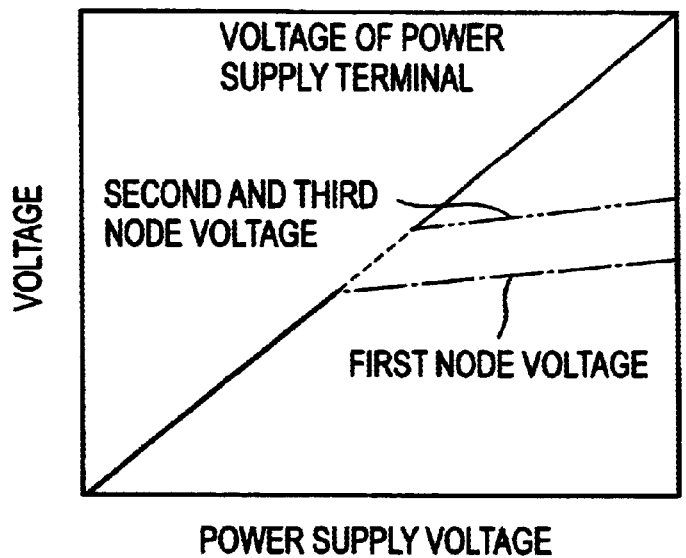
FIG. 3 is a graph showing the voltages at a first node, a second node and a third node to the power supply voltage of the voltage detecting circuit in accordance with the present invention.

FIG. 3 is a graph showing the voltages of the first node 117, a second node 118 and a third node 119 with respect to the power supply voltage of the voltage detecting circuit according to the present invention. The power supply voltage range in this graph is a range in which the output terminal of the voltage detecting circuit according to the present invention becomes equal to the power supply voltage.

As shown in FIG. 3, although the voltage of any node is equal to the power supply voltage till a predetermined power supply voltage is reached, the voltage of the first node 117 which is indicated by a bold line and a dashed line first hardly rises from a power supply voltage of about 2 V even if the power supply voltage rises, and then the voltages of the second node 118 and the third node 119 which are indicated by a bold line and a two-dot chain line hardly rise from a power supply voltage of about 2.5 V. In this way, according to the voltage detecting circuit of the present invention, the first node 117, the second node 118 and the third node 119 do not rise higher than the predetermined voltage. This is because when the voltages between the respective terminals of the MOS transistors of the respective FDSOIs shown in FIG. 1 become about 3 V, it is prevented that kink or punch-through occurs in the MOS transistors of the respective FDSOIs, that the adverse affect of the back channel with an embedded oxide film of the MOS transistor of each of the FDSOIs as a gate oxide film and a common support substrate of the MOS transistor of each of the FEDSOIs as a gate becomes remarkable, and that a circuit which is structured by the MOS transistors of the respective FDSOIs cannot normally operate or the MOS transistors of the respective FDSOIs are destroyed.

In other words, the voltage detecting circuit having the above-mentioned circuit characteristics according to the present invention is not destroyed or does not malfunction even in the case where the power supply voltage is 3 V or higher. Thus, the voltage detecting circuit can be operated by the power supply means which is high in the voltage of the power which is supplied by an Li based battery (having a voltage of about 3 to 4 V) which is large in the battery capacity, and can detect the voltage of the power of the power supply means.

When the common support substrate of the MOS transistors of the respective FDSOIs used in the voltage detecting circuit according to the present invention is so structured as to have the same voltage as that of the first node 117 or the second node 118, the adverse affect due to the back channel at the respective FDSOIPMOSs is eliminated and the adverse affect due to the back channel at the respective FDSOINMOSs is reduced. When the common support substrate is so structured as to have the same voltage as the GND voltage, the adverse affect due to the back channel at the respective FDSOINMOSs is eliminated and the adverse affect due to the back channel at the respective FDSOIPMOSs is reduced.

Also, as shown in FIG. 3, the voltages of the first node 117, the second node 118 and the third node 119 become the voltages that are equal to the power supply voltage when the voltages are lower than a predetermined power supply voltage. This is also the circuit characteristic of the voltage detecting circuit according to the present invention. It is particularly important that in the case where the voltage of the second node 118 is in the vicinity of the lowest operation voltage of the voltage detecting portion, the voltage of the second node 118 becomes the voltage that is the same as the power supply voltage which is the highest voltage. This is because the power supply voltage detecting portion cannot operate at the higher power supply voltage as the voltage of the second node 118 becomes lower than the power supply voltage, with the result that the power supply voltage that enters the indefinite region becomes high. That is, in order to make the power supply voltage that enters the indefinite region lowest, in the voltage detecting circuit according to the present invention, the second D-type FDSOINMOS 115 is disposed between the voltage detecting portion and the power supply terminal so as to input a constant voltage from the constant voltage output circuit to a gate thereof, to connect the power supply terminal 101 to a drain thereof, and to connect the second node 118 which is the power supply terminal of the voltage detecting portion to a source thereof. With this structure, in the case where the power supply voltage is high, an excessive voltage is prevented from being applied to the second node 118 which is the power supply terminal of the voltage detecting portion, and in the case where the power supply voltage is low, the second node 118 which is the power supply terminal of the voltage detecting portion has the same voltage as the power supply voltage.

Apart from the above-mentioned cases, in the case where the voltage of the first node 117 becomes lower than the power supply voltage, the voltage of the second node 118 is caused to be lower than the power supply voltage. Therefore, in the voltage detecting circuit according to the present invention, the constant voltage output circuit structured as described above is applied, and its output is structured by the first node 117, as a result of which in the case where the power supply voltage is low, the voltage of the first node 117 becomes identical with the power supply voltage.

Also, it is needless to say that the circuit structural portion according to the present invention which functions so as to prevent the node voltage from rising in the case where the power supply voltage is high as described above, and to make the node voltage identical with the power supply voltage in the case where the power supply voltage is low can be applied to other CMOS circuits having a node which needs to have such voltages. In particular, in the CMOS circuit for the purpose of improving the highest operation voltage while maintaining the performance of the low voltage operation as it is, the circuit structural portion according to the present invention is applied to the voltage control of the plus side power supply terminal of the CMOS circuit, thereby being capable of realizing the CMOS circuit that achieves the above purpose. Further, in the analog circuit portion, the circuit structural portion according to the present invention is applied to the voltage control of the plus side power supply terminal of the analog circuit portion, thereby being capable of realizing the analog circuit portion which does not fluctuate in the analog characteristic even if the power supply voltage fluctuates in the case of a predetermined power supply voltage or higher.

Furthermore, as shown in FIG. 1, in the voltage detecting circuit according to the present invention, the third D-type FDSOINMOS 116 is disposed between the drain of the second FDSOINMOS 111 for fluctuating the output voltage and the output terminal 103 so as to input the constant voltage from the constant voltage output circuit to a gate thereof, to connect the output terminal 103 to a drain thereof, and to connect the drain of the second FDSOINMOS 111 to a source thereof, as a result of which the output voltage is identical with the power supply voltage in the case where the power supply voltage is a predetermined power supply voltage or higher, and an excessive voltage is prevented from being applied to the drain of the second FDSOINMOS, and the output voltage can be set to the GND voltage until the power supply voltage enters the indefinite region in the case where the power supply voltage is lower than the predetermined power supply voltage.

It is needless to say that the output resistor 110 shown in FIG. 1 or 4 is not required in the case where the terminal of the load circuit which is connected to the output terminal 103 also shown in FIG. 1 or 4 is pulled up by a resistor.

As described above, in the voltage detecting circuit according to the present invention, the MOS transistors of the FDSOIs are applied to the respective MOS transistors in the interior of the voltage detecting circuit, and even if the power supply voltage becomes a voltage of 3 V or higher at which the actions of the MOS transistors of the FDSOIs fail, the voltages between the respective terminals of the MOS transistors of the respective FDSOIs are suppressed to 3 V or lower and in the case where the power supply voltage drops down, the voltages between the respective terminals of the MOS transistors of the respective FDSOIs are not suppressed. With this structure, in the voltage detecting circuit according to the present invention, the suppression of the increase in the current consumption and the lowering of the power supply voltage which enters the indefinite region, which are described as the object as to the conventional voltage detecting circuit, can be solved. Further, even if there is applied the power supply means that supplies the voltage of 3 V or higher at which the actions of the MOS transistors of the FDSOIs included in the circuit fail, while the characteristic that the power supply voltage that enters the indefinite regions lowers is maintained, other characteristics are identical with the characteristics of the conventional voltage detecting circuit.

Moreover, the power supply means which is connected to the power supply terminal of the voltage detecting circuit according to the present invention uses the output voltage of the voltage detecting circuit having the above-mentioned characteristics according to the present invention as a reset signal of the load circuit connected to the power supply terminal, as a result of which the reset signal can be maintained till the power supply voltage which is a stop voltage or lower at which the operation of the load circuit completely stops. Therefore, the load circuit can be prevented from being fatally damaged in the system or hardware manner.

The above description is applied to the voltage detecting circuit according to the present invention. However, it is needless to say that even a circuit having another function, has a common problem to be solved by the present invention when a low voltage operation is required.

As was described above, according to the present invention, in a circuit that achieves a certain function, the lowest operation voltage can be lowered while an increase in the current consumption is suppressed to the minimum and the highest operation voltage is maintained as it is.

Also, in the voltage detecting circuit using the present invention, the power supply voltage at which the output signal of the voltage detecting circuit enters the indefinite regions can be lowered while an increase in the current consumption is suppressed to the minimum and the highest operation voltage is maintained as it is, as compared with the conventional voltage detecting circuit.

Further, in an electronic device having a load circuit such as an operation processing circuit which operates by a power of the power supply means such as the battery, and the voltage detecting circuit using the present invention which operates by the same power as that of the load circuit, in which the voltage detecting circuit detects the voltage of the power, and when the voltage of the power is a predetermined voltage or lower, the load circuit is reset by the output signal of the voltage detecting circuit, since the voltage detecting circuit using the present invention can maintain the reset of the load circuit down to the voltage of the power or lower at which the load circuit cannot completely operate, the load circuit can be prevented from being fatally damaged in the systematic or hardware fashion. In addition, an increase in the current consumption of the electronic device can be suppressed to the minimum, and the voltage of the power does not need to be lowered. Thus, a battery with the voltage of the power becoming high instead of the large capacity can be applied, thereby being capable of suppressing a shortage of the operation period of time of the electronic device.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An electronic device comprising a CMOS circuit having a desired function, and power supply means for supplying a power that drives the CMOS circuit, wherein the CMOS circuit has at least one internal circuit structured by a MOS transistor of a complete depletion type SOI structure, wherein a depletion type n-channel MOS transistor is disposed between the plus side terminal of the power supply means and the plus side power supply terminal of the one internal circuit, which suppresses a source voltage to a desired voltage or lower in the case where a drain voltage is a predetermined voltage or higher, and which gives a gate voltage so that the source voltage becomes equal to the drain voltage in the case where the drain is lower than the predetermined voltage, and wherein the one internal circuit is driven by the power of the power supply means which is supplied from the drain of the depletion type n-channel MOS transistor to the source thereof.

2. An electronic device according to claim 1, wherein the CMOS circuit is a voltage detecting circuit which has a function of detecting a voltage of the plus side terminal of the power supply means, wherein the voltage detecting circuit includes an output terminal that outputs a voltage detection result, a voltage dividing resistor portion that outputs a divided voltage resulting from dividing the voltage of the plus side terminal of the power supply means, a voltage detecting portion that detects the divided voltage and reflects the detection result on an output signal, and an n-channel MOS transistor of a complete depletion type SOI structure a gate of which receives the output signal, and has an output portion that fluctuates the voltage of the output terminal, wherein the voltage detecting portion is structured by a MOS transistor of a complete depletion type SOI structure, and the depletion type n-channel MOS transistor is disposed between the plus side terminal of the power supply means and the pulse side power supply terminal of the voltage detecting portion, wherein the voltage detecting circuit is driven by using the power of the power supply means which is supplied from the drain of the depletion type n-channel MOS transistor to the source thereof, wherein the depletion type n-channel MOS transistor is also disposed between the drain of the n-channel MOS transistor of the complete depletion type SOI structure of the output portion and the output terminal, and wherein a drain current of the n-channel MOS transistor of the completion depletion type SOI structure flows between the drain of the depletion type n-channel MOS transistor and the source thereof.

3. An electronic device according to claim 2 further comprising a load circuit having a desired function, wherein the load circuit is driven by the power of the power supply means and is also reset by the voltage of the output terminal of the voltage detecting circuit in the case where the voltage of the power of the power supply means is a predetermined voltage or lower.

* * * * *